(12) United States Patent
Zang et al.

(10) Patent No.: US 9,831,248 B1
(45) Date of Patent: Nov. 28, 2017

(54) EMBEDDED DRAM CELLS HAVING CAPACITORS WITHIN TRENCH SILICIDE TRENCHES OF A SEMICONDUCTOR STRUCTURE

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/425,366

(22) Filed: Feb. 6, 2017

(51) Int. Cl.
*H01L 21/00* (2006.01)
*H01L 27/108* (2006.01)
*H01L 49/02* (2006.01)
*H01L 23/522* (2006.01)
*H01L 23/532* (2006.01)

(52) U.S. Cl.
CPC .... *H01L 27/10826* (2013.01); *H01L 23/5226* (2013.01); *H01L 23/53209* (2013.01); *H01L 27/1085* (2013.01); *H01L 27/10885* (2013.01); *H01L 27/10891* (2013.01); *H01L 27/10897* (2013.01); *H01L 28/91* (2013.01)

(58) Field of Classification Search
CPC ......... H01L 27/10826; H01L 27/10897; H01L 27/1085; H01L 27/10885; H01L 27/10891; H01L 23/5226; H01L 23/53209; H01L 28/91
See application file for complete search history.

(56) References Cited

U.S. PATENT DOCUMENTS 8,679,968 B2 * 3/2014 Xie ................ H01L 21/823475
438/586
8,937,359 B2 * 1/2015 Xie .................... H01L 29/7827
257/401

(Continued)

*Primary Examiner* — Nicholas Tobergte
(74) *Attorney, Agent, or Firm* — Heslin Rothenberg Farley & Mesiti P.C.

(57) ABSTRACT

A semiconductor structure includes an array of fins extending horizontally across a substrate. A plurality of transistors are embedded in the fins. The transistors include a $1^{st}$ S/D region and a $2^{nd}$ S/D region defining a channel region therebetween. The transistors have a gate structure disposed over the channel region and extending perpendicular to the fins. An ILD layer is disposed over the structure. The ILD layer includes a plurality of TS trenches disposed over the $1^{st}$ and $2^{nd}$ S/D regions. The TS trenches extend parallel to the gate structures. A plurality of storage capacitors are disposed within the TS trenches. The storage capacitors include a $1^{st}$ metal terminal electrically connected to one of the $1^{st}$ and $2^{nd}$ S/D regions, a $2^{nd}$ metal terminal and a capacitor dielectric disposed therebetween. Each transistor is electrically connected to a single storage capacitor to form an eDRAM cell.

20 Claims, 16 Drawing Sheets

(56) References Cited

U.S. PATENT DOCUMENTS

| | | | | |
|---|---|---|---|---|
| 8,999,779 B2* | 4/2015 | Naczas | ............... | H01L 23/535 |
| | | | | 257/353 |
| 9,093,496 B2* | 7/2015 | Jacob | ............... | H01L 21/76243 |
| 9,349,730 B2* | 5/2016 | Jacob | ............... | H01L 21/02532 |
| 9,508,825 B1* | 11/2016 | Basker | ............... | H01L 29/665 |
| 2014/0339629 A1* | 11/2014 | Xie | ............... | H01L 29/7827 |
| | | | | 257/330 |
| 2015/0021690 A1* | 1/2015 | Jacob | ............... | H01L 21/02532 |
| | | | | 257/347 |
| 2015/0024572 A1* | 1/2015 | Jacob | ............... | H01L 21/76243 |
| | | | | 438/404 |
| 2017/0062436 A1* | 3/2017 | Guillorn | ............... | H01L 27/10867 |

* cited by examiner

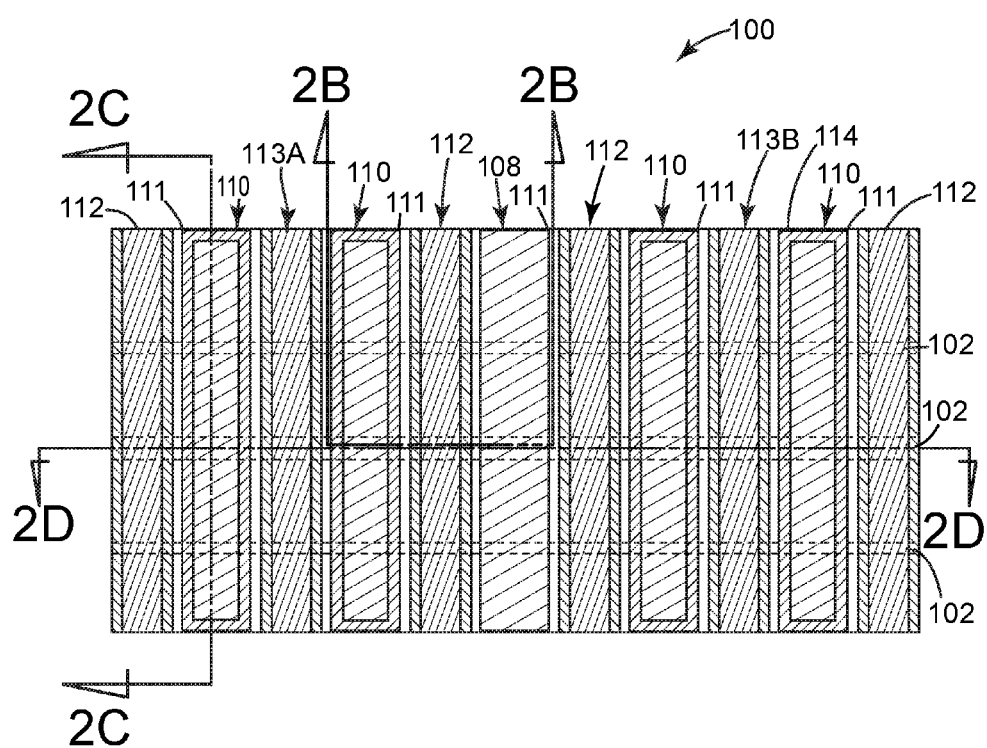

EMBEDDED DRAM CELLS HAVING CAPACITORS WITHIN TRENCH SILICIDE TRENCHES OF A SEMICONDUCTOR STRUCTURE

TECHNICAL FIELD

The present invention relates to semiconductor devices and methods of making the same. More specifically, the invention relates to embedded dynamic random access memory (eDRAM) cells having a capacitor formed within trench silicide trenches of a semiconductor structure.

BACKGROUND

Dynamic random-access memory (DRAM) is a type of random access memory that stores each bit of data in a separate capacitor of a DRAM storage cell within an integrated circuit. Embedded DRAM (eDRAM) is a DRAM integrated with logic circuits on the same die or chip of a semiconductor integrated circuit. Integrated circuits with eDRAIVI have a higher content of logic circuit elements (e.g., FinFETs, transistors, diodes or the like) in close proximity to the eDRAM cells, and more specifically to the eDRAIVI capacitors, than that of conventional integrated circuits with high density DRAM.

One of the largest applications for DRAM (and eDRAM) cells is in the main memory in modern computers, wherein multiple DRAM cells are disposed in memory modules of the computers. One of the advantages of DRAM is its structural simplicity. That is, only one transistor and one capacitor are required per DRAM cell in order to store a bit of data.

Generally, DRAM cell capacitors are fabricated in the middle-end-of-line (MEOL) portion of a conventional semiconductor fabrication process. Problematically however, DRAM cell capacitors are typically subjected to high enough process temperatures (e.g., 600-700 degrees centigrade) to cause significant performance deviations in conventional logic devices such as FinFETs, diodes and similar, which are fabricated in the front-end-of-line (FEOL). As such, many standard logic circuits and standard logic fabrication processes cannot be used with conventional DRAM process steps added into the MEOL.

In contrast, in a conventional prior art eDRAIVI cell, for example, in a FinFET or planar CMOS semiconductor structure, the capacitor is formed in the back-end-of-line (BEOL) and the transistor is formed in the front-end-of-line (FEOL). Accordingly, logic circuits formed in the FEOL are much less affected by the capacitor process temperatures in the BEOL for prior art eDRAM. As such, circuits with conventional eDRAM processed in the BEOL are generally more logic compatible than circuits with conventional DRAM processed in the MEOL.

Problematically however, the capacitor and its associated transistor of the conventional eDRAIVI cell are typically separated by several layers of semiconductor materials through which multiple vias must be formed in order to make the proper electrical connections to form a functional cell. Furthermore, the dielectric used in the formation of eDRAM cell capacitors (typically Si-nitride) generally has poorer quality with higher leakage than other semiconductor capacitors, thus leading to a need for a relatively thicker dielectric for the eDRAM cell capacitor. This tends to increase the overall footprint of the eDRAM cells and to increase the process complexity required to manufacture the eDRAM cells.

Accordingly, there is a need for an eDRAM cell structure, and method of making the same, wherein both the capacitor and transistor are formed in the FEOL. Additionally, there is a need to decrease the footprint of the eDRAIVI cell and to simplify the process flow required to form the eDRAM cell. Additionally, there is a need to form the capacitor of an eDRAM cell with a lower temperature process than conventional DRAM cell fabrication at the MEOL.

BRIEF DESCRIPTION

The present invention offers advantages and alternatives over the prior art by providing a semiconductor structure with an eDRAM cell, wherein the eDRAM cell includes a storage capacitor embedded in a trench-silicide (TS) trench. Embedding the storage capacitors of eDRAM cells in the TS trenches of a semiconductor structure reduces the footprint and simplifies the flow process of the eDRAM cells. Additionally, the process temperatures used in the fabrication of the eDRAM capacitors of the invention (e.g., 400-450 degrees centigrade), are lower than that of prior art DRAM cell capacitors, making them more logic compatible.

A semiconductor structure in accordance with one or more aspects of the present invention includes an array of fins extending horizontally across a substrate. A plurality of transistors are embedded in the fins. The transistors include a 1st S/D region and a 2nd S/D region defining a channel region therebetween. The transistors have a gate structure disposed over the channel region and extending perpendicular to the fins. An ILD layer is disposed over the structure. The ILD includes a plurality of TS trenches disposed over the 1st and 2nd S/D regions and extending parallel to the gate structures. A plurality of storage capacitors are disposed within the TS trenches. The storage capacitors include a 1st metal terminal electrically connected to one of the 1st and 2nd S/D regions, a 2nd metal terminal and a capacitor dielectric disposed therebetween. Each transistor is electrically connected to a single storage capacitor to form an eDRAIVI cell.

A method in accordance with one or more aspects of the present invention includes providing a semiconductor structure. The structure includes:

an array of fins extending horizontally across a substrate, a plurality of transistors embedded in the fins, the transistors having a 1st S/D region and a 2nd S/D region defining a channel region therebetween, the transistors also having a gate structure disposed over the channel region and extending perpendicular to the fins, and an ILD layer disposed over the structure, the ILD including a plurality of TS trenches disposed over the 1st and 2nd S/D regions and extending parallel with the gate structures.

A plurality of storage capacitors is formed within the TS trenches. The storage capacitors include a 1st terminal, a 2nd terminal and a capacitor dielectric disposed therebetween. One of the 1st and 2nd S/D regions of each transistor is electrically connected to the 1st terminal of a single storage capacitor to form a plurality of eDRAIVI cells.

DRAWINGS

The invention will be more fully understood from the following detailed description taken in conjunction with the accompanying drawings, in which:

FIG. 2A is a top view of a semiconductor structure having eDRAM cells in accordance with the present invention;

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
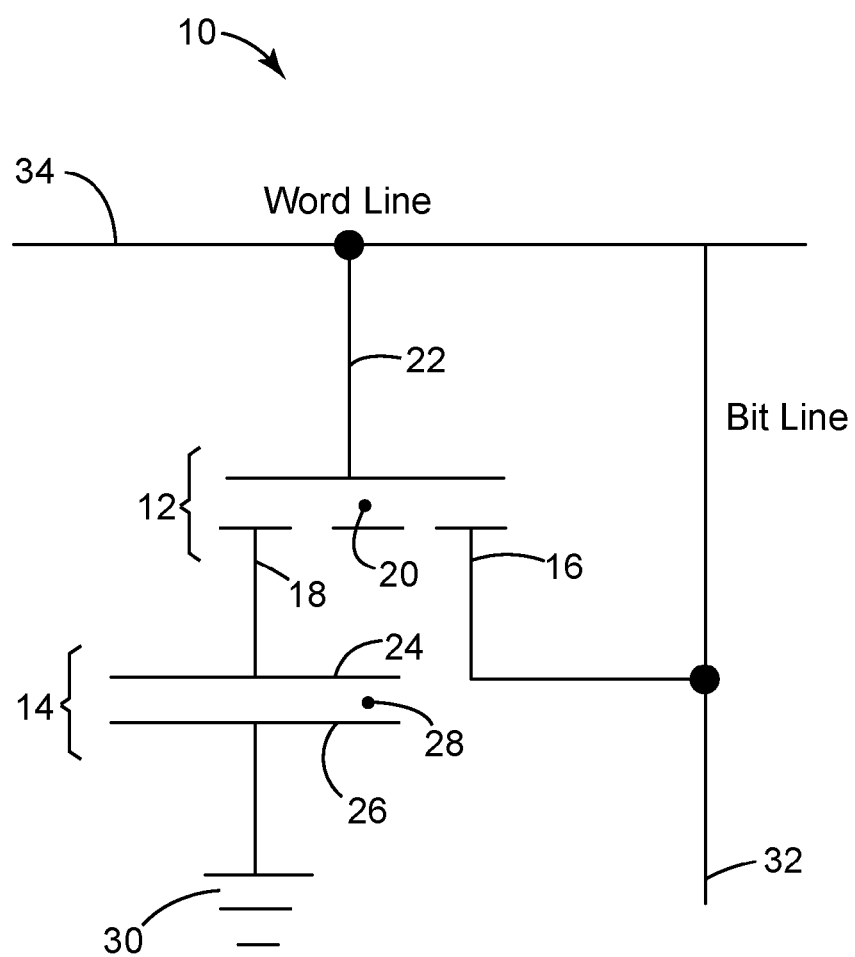
FIG. 1 is a schematic diagram of a DRAM cell in accordance with the present invention.

FIG. 1 is an electrical schematic diagram of an eDRAM cell 10 in accordance with the present invention. FIGS. 2A-2D illustrate a semiconductor structure 100 having an eDRAM cell 116 in accordance with the present invention. FIGS. 3-9 illustrate an exemplary embodiment of a method of making the eDRAM cell 100 in accordance with the present invention. FIGS. 10-19 illustrate various alternative embodiments, and methods of making the same, of a semiconductor structure 200 having an eDRAM cell 201 in accordance with the present invention.

Referring to FIG. 1, an electrical schematic diagram of a DRAM cell 10 in accordance with the present invention is presented. The cell 10 includes a transistor 12 and a storage capacitor 14. The transistor 12 includes source 16, a drain 18 and a channel 20 connected therebetween. The transistor 12 also includes a gate 22, operable to control electrical conduction through the channel 20 and between the source 16 and drain 18. The capacitor 14 includes a first terminal 24 and a second terminal 26 which are electrically separated by a capacitor dielectric 28. The dielectric 28 has a geometric shape and dielectric constant (or k value) that is operable to store a predetermined charge between the terminals 24, 26. Terminal 24 of the capacitor 14 is connected to the drain 18 of the transistor 12. Terminal 26 of the capacitor 14 is connected to a system electrical ground 30. Source 16 of transistor 12 is connected to a bit line 32. Gate 22 of transistor 12 is connected to a word line 34.

In operation, a voltage is applied to the word line 34 to activate the gate 22 and turn on the channel 20, therefore electrically connecting the storage capacitor 14 to the bit line 32. This allows high and low logic voltage levels (bits) to be transferred between the storage capacitor 14 and the bit line 32.

DRAM cells 10 are typically arranged in logic arrays (not shown) of rows and columns that can range from a plurality of a few cells to many thousands of cells in an array. The rows of the arrays generally function as the word lines 34, which may be electrically connected in common with many gates 22 of many transistors 22. The columns of the arrays generally function as the bit lines 32, which may be electrically connected in common with many sources 16 of many transistors 22. However, each DRAM cell 10 has only one storage (or cell) capacitor 14 associated with it and not connected in common with either word line 34 or bit line 32. It is these logic arrays that make up the main memory of many electronic devices such as computers or similar.

Figure 2B:
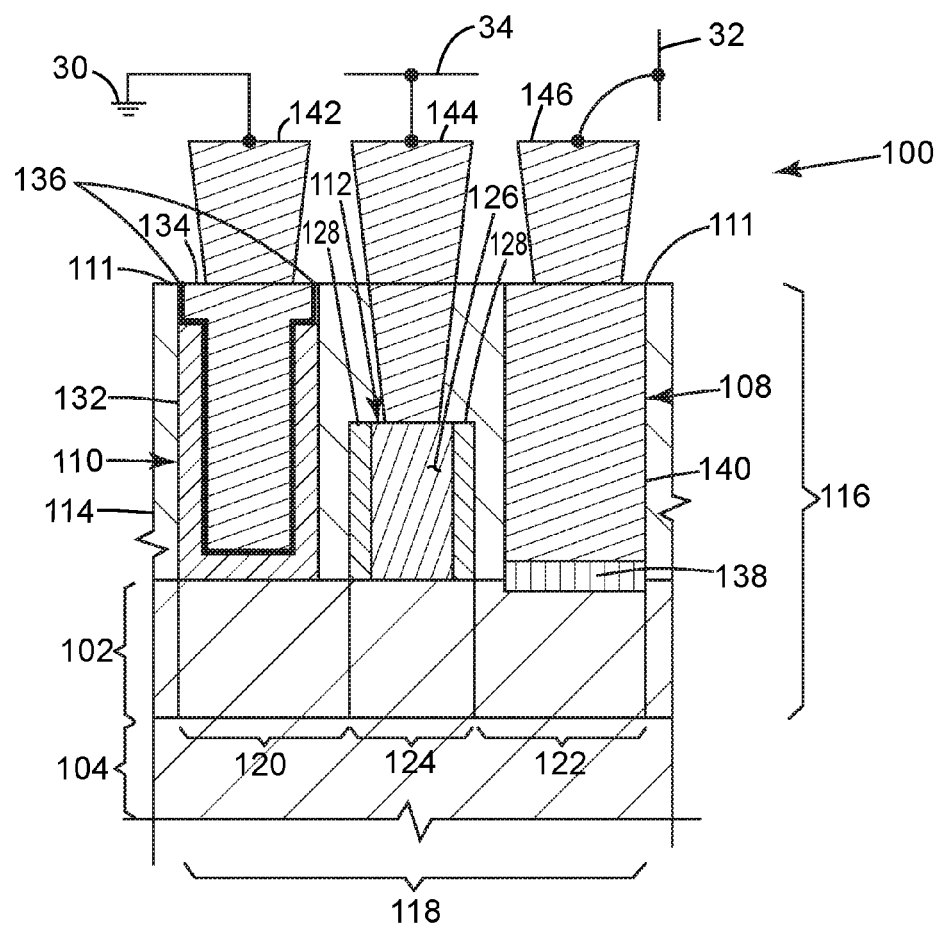
FIG. 2B is a cross-sectional view of FIG. 2A taken along the line 2B-2B in accordance with the present invention.
Figure 2C:
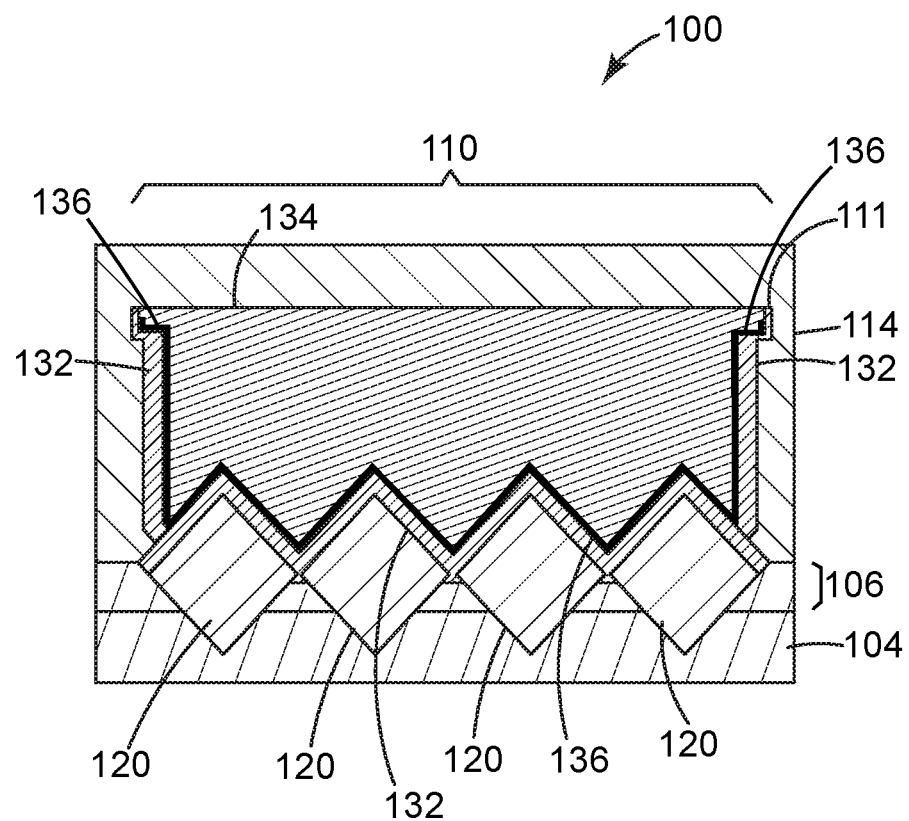
FIG. 2C is a cross-sectional view of FIG. 2A taken along the line 2C-2C in accordance with the present invention.
Figure 2D:
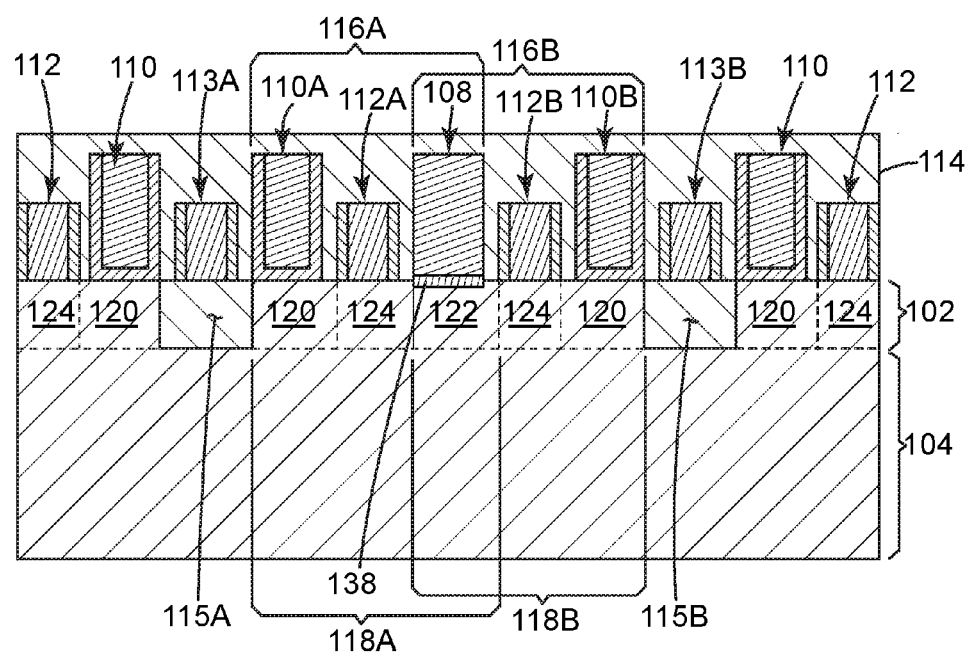
FIG. 2D is a cross-sectional view of FIG. 2A taken along the line 2D-2D in accordance with the present invention.

Referring to FIGS. 2A, 2B, 2C and 2D, an exemplary embodiment of a semiconductor structure 100 at an intermediate stage of manufacture having a plurality of eDRAM cells 116 (best seen in FIG. 2B) that operate per the schematic diagram 10 in accordance with the present invention is presented. FIG. 2A is a top cross-sectional view of structure 100, FIG. 2B is a side cross-sectional view of structure 100 taken along the line 2B-2B, FIG. 2C is a side cross-sectional view of structure 100 taken along the line 2C-2C and FIG. 2D is a side cross-sectional view of structure 100 taken along the line 2D-2D.

Referring more specifically to FIG. 2A, structure 100 includes an array of fins 102 extending horizontally across a bulk silicon substrate 104 (best seen in FIG. 2B). The fins 102 are designed generally for fin field effect transistors (FinFETs) and extend upwards from the substrate 104 through a flowable oxide (FOX) layer 106 (best seen in FIG. 2B). The FOX layer 106 surrounds and is disposed between fins 102.

Though this specific exemplary embodiment illustrates the fins 102 formed on a bulk substrate structure 104, one skilled in the art would recognize that the fins could also be formed on a silicon-on-insulator (SOI) structure as well. In that case, the fins would be formed from a silicon layer on top of a buried oxide (BOX) layer. The BOX layer would be disposed on the substrate 104.

Extending perpendicular to the fins 102 are a plurality of trench-silicide (TS) structures 108 and storage capacitors structures 110, both of which are disposed in a plurality of trench-silicide (TS) trenches 111. Also extending perpendicular to the fins 102 are a plurality of gate structures 112, which are alternatingly disposed in parallel with the TS trenches 111.

Also extending perpendicular to the fins 102 are a plurality of dummy gate structures 113. As will be explained in greater detail herein, the dummy gates 113 are disposed above isolations regions 115 (best seen in FIG. 2D), which are used to isolate various eDRAIVI cells 116 (best seen in FIG. 2B) from each other. In this embodiment, the combination of the dummy gates 113 and isolations regions 115 form a series of single diffusion breaks (SDB) that electrically separate pairs of the eDRAIVI cells 116 that share a common TS structure 108 (best seen in FIG. 2D).

Disposed over the semiconductor structure 100 is an interlayer dielectric (ILD) layer 114, which may be an oxide layer. From this top cross-sectional view, the ILD layer 114 covers the fins 102, gates 112 and dummy gates 113, so they are illustrated in dotted line format. Also from this top view, the TS structures 108 and storage capacitor structures 110 extend vertically through the ILD layer 114 so their top surfaces are illustrated in solid line format.

In this embodiment, there is one TS structure 108 repetitively alternating with a pair of adjacent capacitors 110 across the entire semiconductor structure 100. Bordering the adjacent capacitors 110 are a pair of dummy gates 113A, 113B (collectively 113) that are utilized to provide electrical isolation. As will be discussed in greater detail herein, the pairing of two adjacent capacitors 110 with one TS structure 108 is done to save valuable space on the structure 100. However, this pairing is not necessary to form an eDRAIVI cell 116 (best seen in FIG. 2B). What is required is that there be at least one capacitor 110 for each TS structure 108.

Referring more specifically to FIG. 2B, a side cross-sectional view of FIG. 2A taken along the line 2B-2B is presented. FIG. 2B is also a cross-sectional view of an exemplary embodiment of an eDRAIVI cell 116, which functions as described per electrical schematic 10 in accordance with the present invention.

Just as schematically illustrated in the DRAM cell diagram 10 of FIG. 1, the eDRAM cell 116 includes a transistor 118 embedded in the fins 102 connected to the storage capacitor structure 110. The transistor 118 includes a first (1st) source/drain (S/D) region 120 and a second (2nd) S/D region 122 defining a channel region 124 therebetween. The 1st S/D 120, 2nd S/D 122 and channel 124 are all embedded in (or part of) fin 102.

In this embodiment, for the particular transistor 118 illustrated in FIG. 2B, the 1st S/D region 120 functions as a source and the 2nd S/D region 122 functions as a drain. One skilled in the art though, would recognize that either S/D region 120, 122 could function as a source or a drain for any of the transistors 118 depending on engineering requirements, and are structurally indistinguishable from each other. However, for purposes of clarity herein, what does distinguishes the 1st S/D region 120 from the 2nd S/D region 122 is that the 1st S/D regions 120 are exclusively directly connected to the storage capacitors 110 and the 2nd S/D regions 122 are exclusively directly connected to the TS structures 108.

The transistor 118, also includes the gate structure 112. Gate 112 is disposed over the channel 124 and is operable to control electrical continuity through the channel 124 and between the S/D regions 120, 122. The gate 112 includes gate metal (or gate metal stack) 126 disposed between a pair of gate spacers 128.

The gate spacers 128 are composed of a dielectric material such as SiN, SiBCN or similar. The gate metal 126 is typically a stack of gate metals, metal nitride, and high-k dielectric, which generally includes three main groups of structures (not shown). Those three main structures are: the gate dielectric layers (typically a high-k dielectric material), the work-function metal structures (typically TiN, TaN, TiCAl, other metal-nitrides or similar materials) and the gate electrode metal (typically Al, W, Cu or similar metal). The gate dielectric layers are used to electrically insulate the work-function metal structures and the gate electrodes from the substrate. The work-function metal structures are generally metal-nitrides that provide the work-function needed for proper FinFET operation, but typically have 10 to 100 times larger resistivity than the gate electrodes. The gate electrodes are metals with a very low resistivity.

The storage capacitor 110 of the eDRAM cell 116 is disposed in one of the TS trenches 111, which were formed earlier in the process flow of structure 100.

The storage capacitor 110 includes a first metal (1st) terminal 132 a second metal (2nd) terminal 134 and a capacitor dielectric 136, which combined form a metal-insulator-metal (MIM) type capacitor. The 1st terminal 132 is disposed as a metal liner and may be composed of such materials as titanium nitride (TiN), titanium (Ti), nickel (Ni), tungsten (W) or similar. The 2nd terminal 134 is formed from the same TS metallization process utilized to form the TS structures 108 disposed in their respective TS trenches 111 and therefore is composed of the same conduction metal 140. Such conduction metal 140 may be titanium nitride TiN, tantalum nitride (TaN) and/or such bulk conducting materials as tungsten (W), cobalt (Co), ruthenium (Ru) or similar. The capacitor dielectric 136 may be a high-k dielectric liner, which may be composed of such material as hafnium dioxide (HfO2), nitride hafnium silicates (HfSiON) or the like.

The TS structure 108 is also disposed in a TS trench 111 and formed with the same material as the 2nd terminal 134 of capacitor 110. TS structure 108 is disposed upon and electrically connected with the 2nd S/D region 122 of transistor 118. The TS structures (or TS layers) 108 are disposed over the S/D regions 120, 122 by a process of TS metallization. The TS metallization process may include formation of a bottom silicide layer 138 over the S/D regions 120, 122 followed by deposition of a top TS conduction metal layer 140. The bottom silicide layer 138 may be composed of NiSi, TiSi2, CoSi2, WSi2 or other like silicides. The TS conduction metal layer 140 may be composed of TiN, TaN and bulk conducting materials such as W, Co, Ru or similar. The TS structures 108 extend longitudinally across the active region of the semiconductor structure 100 in order to ensure proper electrical contact with the S/D regions 120, 122 in the array of fins 102 even under worst case misalignment conditions.

The 1st terminal 132 of capacitor 110 is disposed upon and electrically connected to the 1st S/D region 120 of transistor 118. The 2nd terminal 134 of capacitor 110 is connected to a source/drain (CA) contact 142. CA contact (or CA contact metal) 142 is a part of an interconnect system of structure 100, which connects the 2nd terminal of capacitor 110 to a system ground 30 per schematic diagram 10.

The gate metal 126 of the gate structure 112 of transistor 124 is electrically connected to a gate (CB) contact (or CB contact metal) 144, which is also part of the interconnect system of structure 100 and which connects the gate structure 112 to a word line 34 in similar fashion as that of schematic diagram 10. Additionally, the TS structure 108 is electrically connected to another CA contact 146, which is also a part of the interconnect system of structure 100 and which connects to a bit line 32. Therefore the 2nd S/D region 122 is also electrically connected through TS structure 108 to the system bit line 32 in accordance with schematic 10.

In operation, a voltage is applied to the word line 34 to activate the gate 112 and turn on the channel 124, therefore electrically connecting the storage capacitor 110 to the bit line 32 through transistor 118. This allows high and low logic voltage levels (bits) to be transferred between the storage capacitor 110 and the bit line 32.

Unlike prior art eDRAM cells 116, the capacitor 110 is a MIM capacitor formed within a TS trench 111 of structure 100. Advantageously, with the storage capacitor 110 disposed within the TS trench 111, the eDRAM cell 116 is much more compact than prior art eDRAM cells. Further, as will be discussed in more detail herein, the flow process for manufacturing such cells is simplified relative to prior art eDRAM cells.

Additionally, the process temperature ranges utilized to form the TS structures 108 and the capacitors 110 are significantly lower than the process temperature ranges utilized in the formation of prior art capacitors for prior art eDRAM cells. Typically the process temperature for formation of the TS structures 108 and capacitors 110 range less than 450 degrees centigrade (C).

Referring more specifically to FIG. 2C, a cross-sectional view of FIG. 2A taken along the line 2C-2C is presented. FIG. 2C is also a cross-sectional view of storage capacitor 110. As can be seen from this view, the entire perimeter of TS trench 111 is conformally coated with the metal liner which is the 1st capacitor terminal 132, including the bottom of the TS trench 111 where a plurality of the S/D regions 120 are disposed along the TS trench 111. The high k dielectric layer 136 is disposed over the 1st capacitor terminal 132 and also coats the 1st terminal 132 along the entire perimeter of the trench 111. The 2nd terminal 134, which is composed of the same TS conduction metal as in the TS structure 108, is disposed in and substantially fills the TS trench 111. Though the 1st terminal 132 is shown in FIG. 2C as being electrically connected to a 1nd S/D region 120, one skilled in the art would recognize that the 1st terminal may be connected to one of the 1st and 2nd S/D regions 120, 122 of a transistor depending on engineering requirements. In other words, the 1st terminal 132 may be connected to the 1st S/D region 120, the 2nd S/D region 122 or both S/D regions 120 and 122 depending on the technical requirements.

Referring more specifically to FIG. 2D, a cross-sectional view of FIG. 2A taken along the line 2D-2D is presented. In this view, it can be seen that there are two fully functioning transistors 118A and 118B that share the same TS structure 108. That is, the single TS structure 108 is electrically connected to the S/D regions 122 of the pair of transistors 118A, 118B to form a pair of eDRAM cells 116A, 116B.

However, the transistors 118A and 118B each must be connected to their own unique capacitor 110A and 110B respectively in order to function as two separate eDRAM cells 116A and 116B. In this manner (i.e. 2 adjacent eDRAM cells sharing one TS structure 108), further space can be saved over the structure 100.

It is important to also note that the eDRAM pair 116A and 116B are bounded by a pair of dummy gates 113A and 113B (collectively the dummy gates 113), which are disposed over a pair of isolation regions 115A and 115B (collectively the isolation regions 115) The combination of the dummy gates disposed over isolation regions 115 function as single diffusion breaks (SDBs) that isolate the storage capacitors 110A, 110B from other storage capacitors 110 in adjacent eDRAM cell pairs (only partially shown).

Though this embodiment illustrates an SDB, one skilled in the art would recognize that the eDRAM cells 116A, 116B could be separated with other types of isolation regions. For example, the eDRAM cells could be isolated with a well-known double diffusion break (DDB) where the isolation regions 115 would typically be much larger in volume than in an SDB.

FIGS. 3-9, illustrate an exemplary embodiment of a method of forming the eDRAM cell 116 described in FIGS. 2A, 2B, 2C and 2D.

Figure 3:
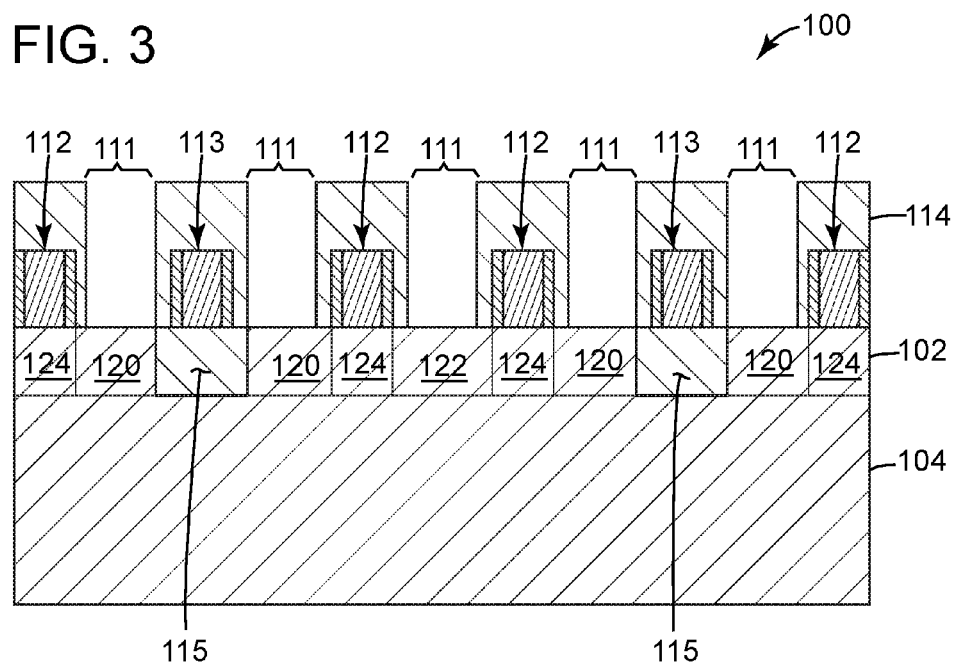
FIG. 3 is a cross-sectional view of FIG. 2D at an intermediate stage of manufacture in accordance with the present invention.

Referring to FIG. 3, cross-sectional view of FIG. 2D at an intermediate stage of manufacture is presented. At this stage of the process flow the transistors 118 (including the S/D regions 120 and 122, channels 124 and gate structures 112) have been formed into the fins 102. Additionally, the TS trenches 111 have been etched into the ILD oxide layer 114. Also the SDBs, which are composed of the dummy gates 113 disposed over isolation regions 115, have been formed.

Figure 4:
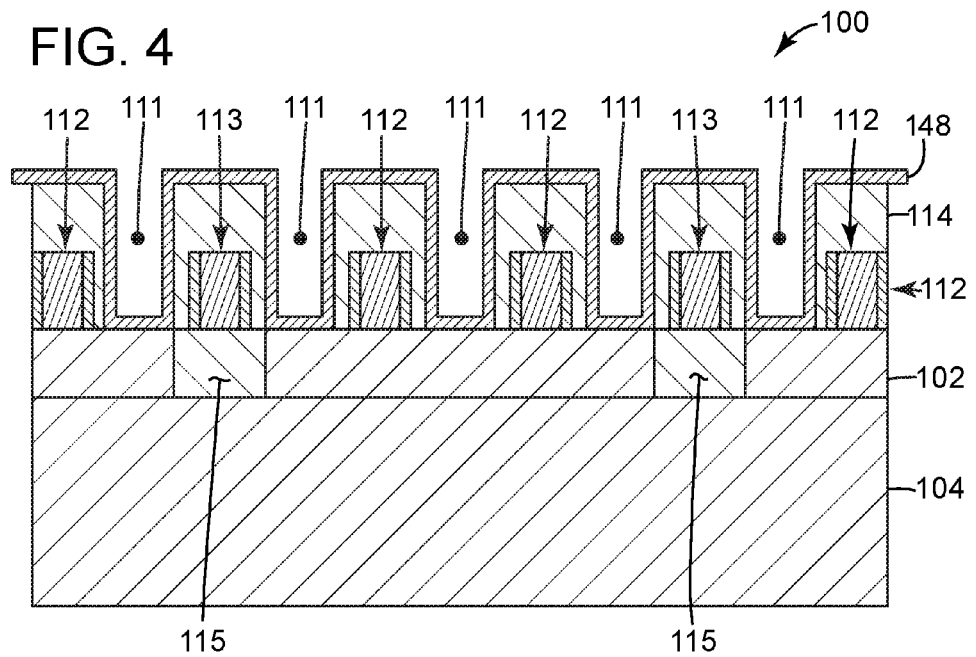
FIG. 4 is a cross-sectional view of FIG. 3 having a metal liner layer disposed over TS trenches in accordance with the present invention.

Referring to FIG. 4, a metal liner layer 148 is conformally disposed over the structure 100, including the trenches 111. The metal liner layer 148 may be composed of such materials as TiN, Ti, Ni, W or similar. The metal liner layer 148 can be disposed by such means as atomic layer deposition (ALD), electroless plating, chemical vapor deposition (CVD), physical vapor deposition (PVD) or similar.

Figure 5:
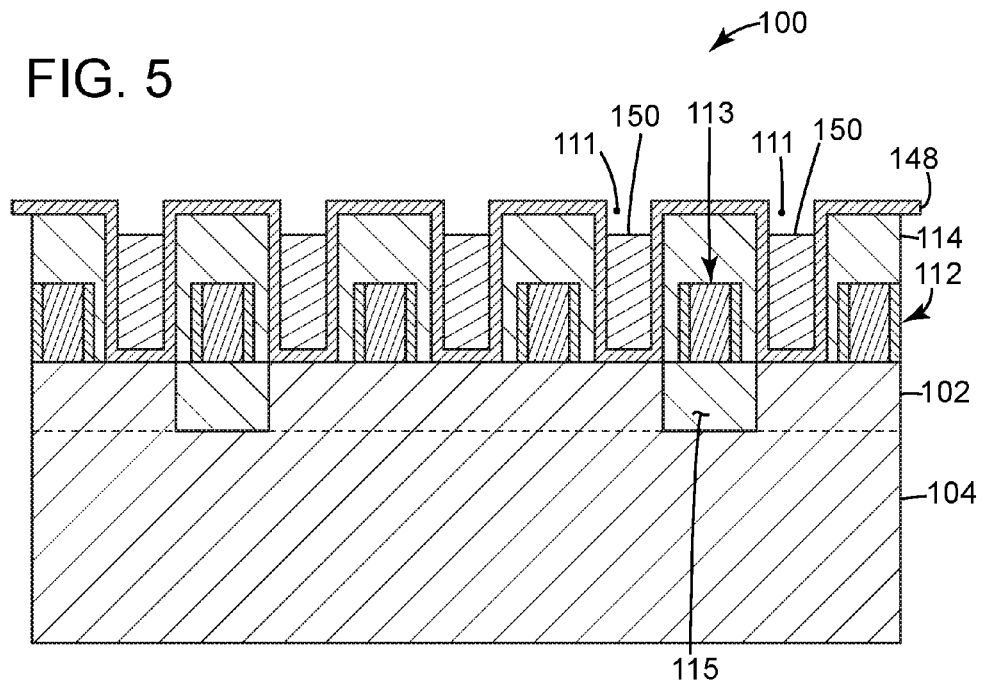
FIG. 5 is a cross-sectional view of FIG. 4 having the TS trenches filled with an ODL layer in accordance with the present invention.

Referring to FIG. 5, next an organic dielectric layer (ODL) 150 is disposed over the structure 100 to fill the TS trenches 111. The ODL 150 can be applied with a variety of spin-on techniques or similar. The ODL may be composed of a photo resist material, or an organic polymer such as epoxy resin, polyacrylate resin or similar.

The ODL 150 is then recessed (or etched) back to expose the metal liner layer 148 disposed over the top surface of the IDL layer 114 as well as the metal liner layer 148 disposed over the upper portion (e.g., top half or top eighth) of the trenches 111. This may be done using a reactive ion etching (RIE) process or similar.

Figure 6:
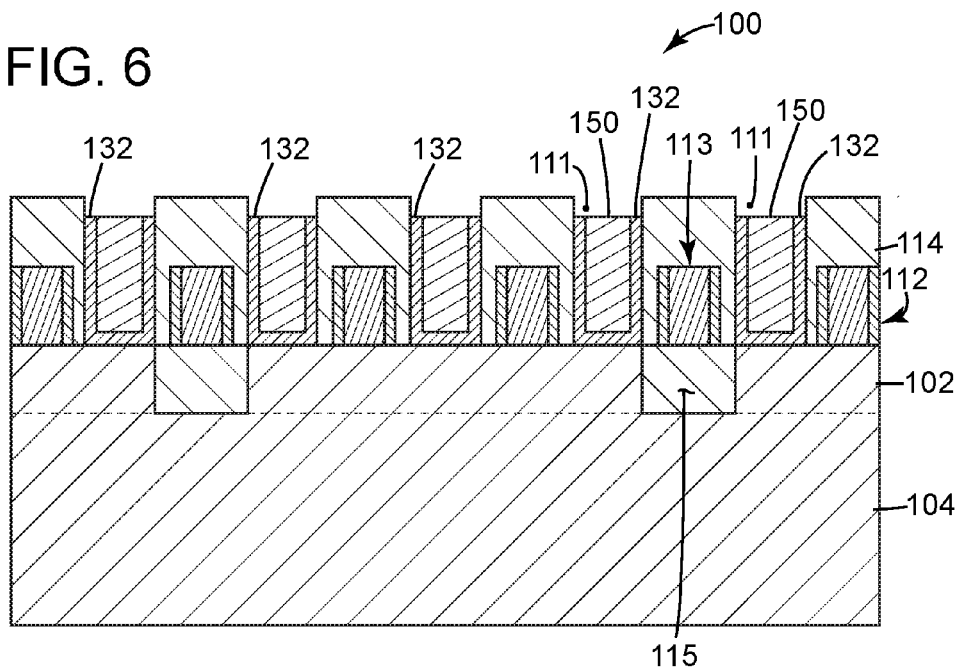
FIG. 6 is a cross-sectional view of FIG. 5 having the metal liner layer recessed in accordance with the present invention.

Referring to FIG. 6, next the exposed portions of the metal liner layer 148 that are not protected by the ODL layer 150 are removed to form the 1st capacitor terminal 132 in the trenches 111. This can be done by a RIE process or similar.

Figure 7:
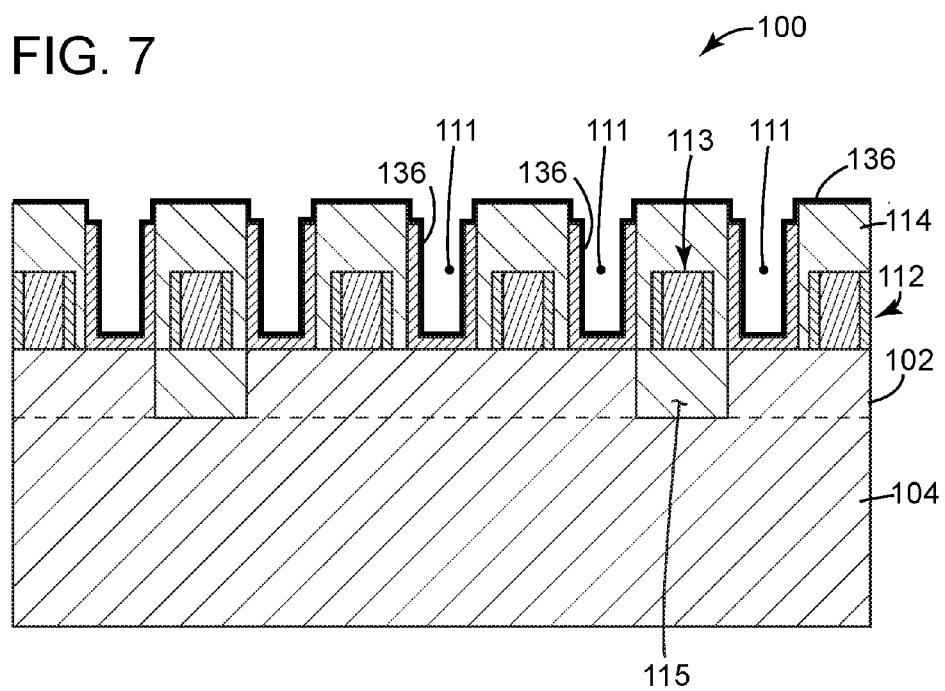
FIG. 7 is a cross-sectional view of FIG. 6 having the ODL layer removed and a capacitor dielectric layer disposed thereon in accordance with the present invention.

Referring to FIG. 7, next the ODL layer 150 is removed and a capacitor high k dielectric layer 136 is conformally coated over the structure 100, including over the metal liner 1st terminal 132 disposed around the perimeter of the TS trenches 111. The ODL layer 150 may be removed by a wet etch process or similar. The dielectric layer 136 may be deposited by using an ALD process or similar.

Figure 8:
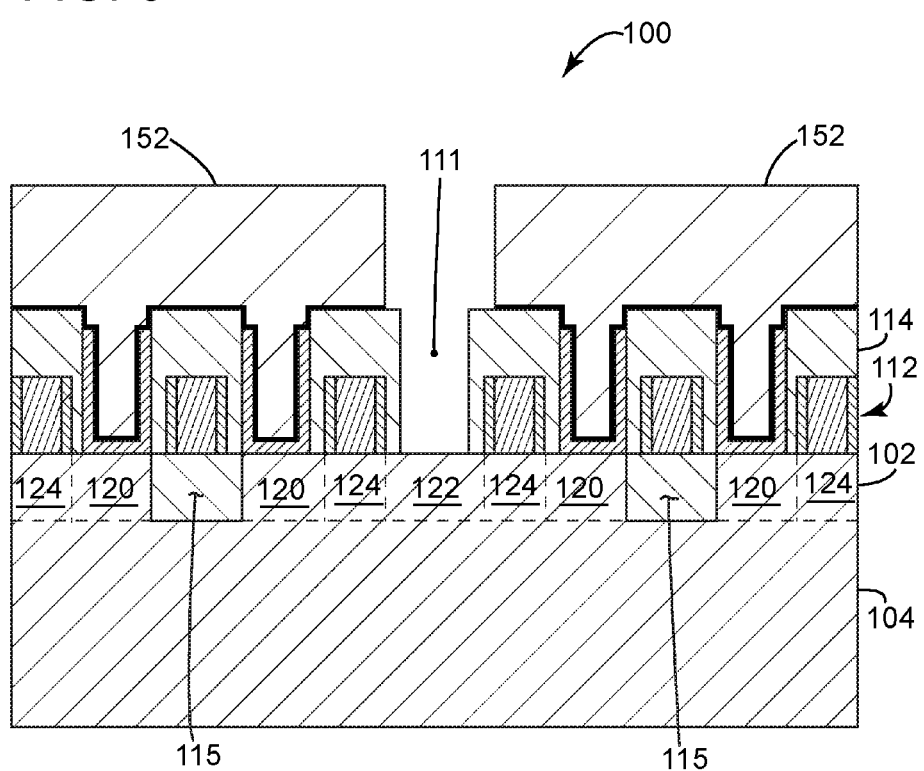
FIG. 8 is a cross-sectional view of FIG. 7 having a block mask layer disposed thereon and both the capacitor dielectric layer and metal liner layer removed from exposed TS trenches in accordance with the present invention.

Referring to FIG. 8, next a block mask layer 152 is disposed over the structure 100 to expose only those trenches 111 that will be utilized to form the TS structures 108. The block mask layer 152 covers those TS trenches 111 which are utilized to form the storage capacitors 110. The block mask layer 152 may be an organic planarization layer (OPL) composed of an amorphous silicon or an amorphous carbon and may be applied using spin-on techniques.

Once the block mask layer 152 is applied, the high k dielectric layer 136 and the metal liner 1st terminal layer 132 are removed from the exposed TS trenches 111. This may be done by a series of wet or dry etching processes or similar. By removing the dielectric layer 136 and metal liner 1st terminal layer 132 from the selected TS trenches 111, the S/D areas 122, 120 are exposed at the bottoms of the selected TS trenches.

Figure 9:
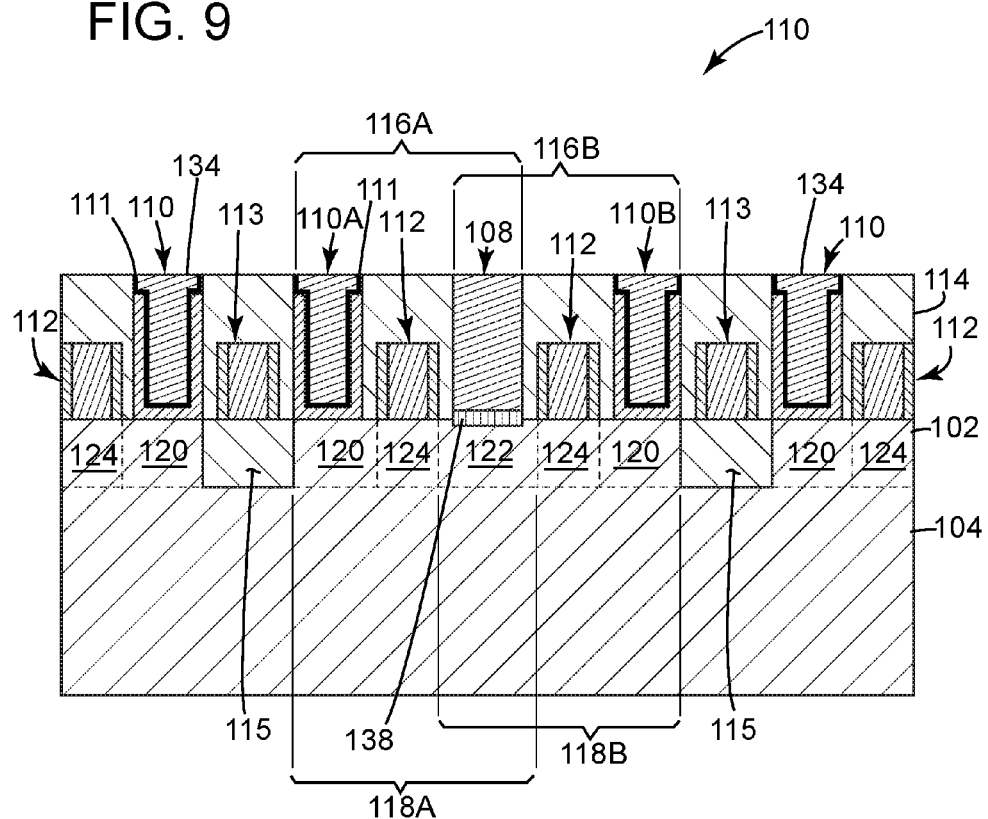
FIG. 9 is a cross-sectional view of FIG. 8 having the TS trenches filled with TS conduction metal to complete the formation of eDRAIVI cells in accordance with the present invention.

Referring to FIG. 9, next the silicide layer 138 is then formed over the exposed S/D regions 122 at the bottom of the trenches 111 that are to be utilized to form the TS structures 108. The block mask layer 152 is then removed by such processes as wet etching or similar.

The silicide formation may be done by first disposing a silicide metal layer (not shown) over the structure 100 and annealing the silicide metal layer to form the silicide layer 138 over the S/D regions 120 that are in direct contact with the silicide metal layer 138. The silicide metal layer may be composed of such metals as titanium (Ti), nickel (Ni), cobalt (Co), tungsten (W) or the like. The silicide layer 138, which has been formed by the heat induced reaction of the silicide metal layer (not shown) with the silicon (Si) in the S/D regions 120, may be composed of TiSi2, NiSi, CoSi2, WSi2 or similar. In this embodiment, the un-reacted silicide metal layer is then removed, leaving only the silicide layer 138 disposed at the bottom of the TS trenches 111.

Please note that in this specific embodiment, the silicide layer 138 is shown exclusively over the 2nd S/D regions 122 that are located under the TS structures 108 (best seen in FIG. 2B). Note also that in this specific embodiment, no silicide layer is shown over the 1st S/D regions 120 that are located under the 1st terminals 132 of the capacitors 108 (also best seen in FIG. 2B).

Next the TS conduction metal is disposed over the entire structure to fill all of the TS trenches 111 and planarized down to complete the formation of the eDRAIVI cells 116. The conduction metal 140 disposed in the TS trenches 111 utilized to form the capacitors 110 becomes the 2nd terminal 134 of those capacitors. The conduction metal 140 disposed in the TS trenches 111 utilized to form the TS structure 108 forms an ohmic contact with the S/D regions 122 through the silicide layer 138 to complete the formation of the TS structures 108. (Note: in this flow, only the bottom of TS structures has silicides 138).

Note also that in this embodiment, there are two fully functioning transistors 118A and 118B that share the same TS structure 108. That is single TS structure 108 is electrically connected to the S/D regions 122 of a pair of transistors 118A, 118B to form a pair of eDRAM cells 116A, 116B.

However, the transistors 118A and 118B each must be connected to their own unique capacitor 110A and 110B respectively in order to function as two separate eDRAM cells 116A and 116B. In this manner (i.e. 2 adjacent eDRAM cells sharing one TS structure 108), further space can be saved over the structure 100.

Referring to FIGS. 10-19, illustrate various alternative embodiments, and methods of making the same, of a semiconductor structure 200 having an eDRAM cell 201 in accordance with the present invention.

Figure 10:
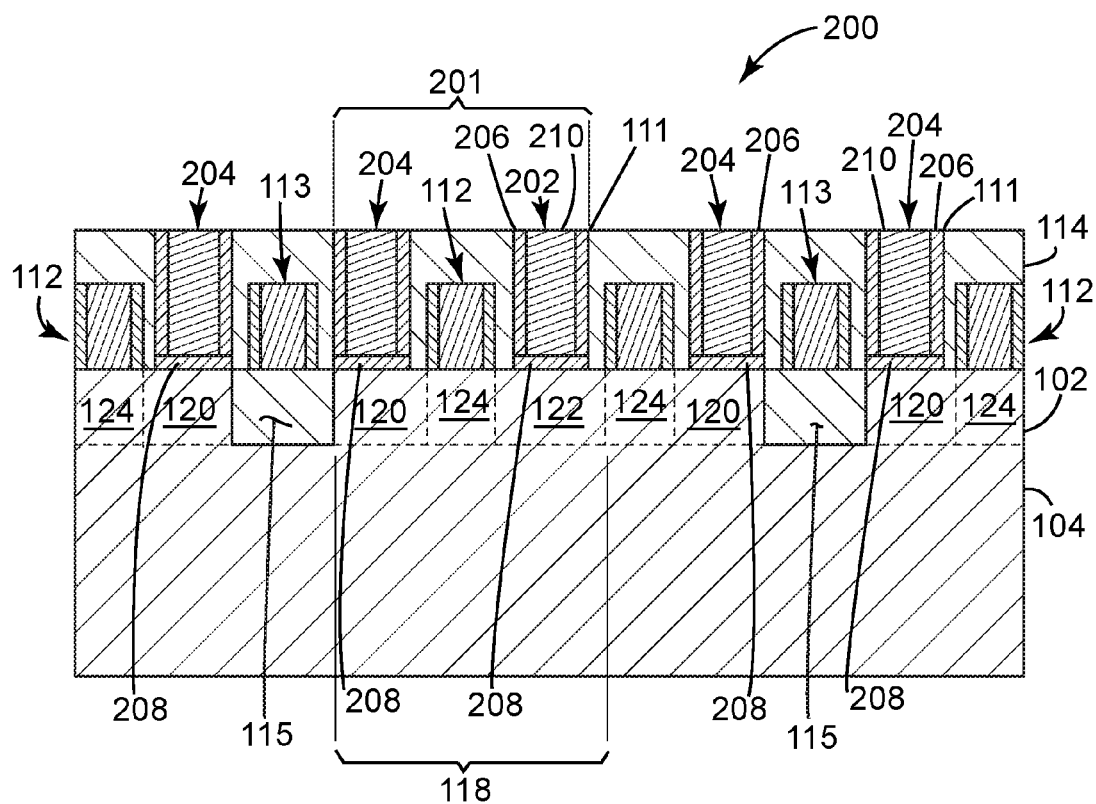
FIG. 10 is another embodiment of a semiconductor structure at an intermediate stage of manufacture in accordance with the present invention.

Referring to FIG. 10, a cross-sectional view of a semiconductor structure 200 at an intermediate stage of manufacture in accordance with the present invention is illustrated. As will be explained in greater detail herein, semiconductor structure 200 will be formed with a plurality of eDRAIVI cells 201 embedded therein. However, unlike the eDRAIVI cells 116 discussed in FIGS. 2-9, the capacitors 204 associated with these eDRAIVI cells 201 will have a different construction than that of the capacitors 110 associated with the eDRAIVI cells 116.

More specifically, the capacitors 110 of eDRAM cells 116 included a 1st terminal 132 formed from a metal liner layer 148 and a 2nd terminal 134 formed from the TS conduction metal 140 (best seen in FIG. 2C). In contrast, the capacitors 204 of eDRAIVI cells 201 will have a 1st terminal formed from the TS conduction metal 210 and a 2nd terminal formed from a CA capacitor contact (or CA capacitor contact metal) 222 (best seen in FIG. 14).

Herein, normal CA contacts 226 are those contacts that perform the conventional function of electrically activating the S/D regions 122 through the TS structures 202. By contrast herein, CA capacitor contacts 222 are similar to CA contacts 226 in material composition and structure, but connect to capacitor 204 and function herein as the 2nd metal terminal 222 of the MIM capacitor 204. As such, the CA contacts 226 land on TS structures 202 only and the CA capacitor contacts 222 land on storage capacitors 204 only.

At the stage of the process flow illustrated in FIG. 10, the semiconductor structure 200 includes substantially the same substrate 104, fins 102, FOX layer 106 and ILD layer 114 as that of structure 100. Additionally, the construction of the transistors 118 are substantially the same as in structure 100, including the gate structures 112, S/D regions 120, 122 and channel regions 124. Additionally, the SDBs are substantially the same as in structure 100, including the dummy gate structures 113 disposed over the isolation regions 115.

However, the partially formed TS structures 202 and storage capacitors 204 within the TS trenches 111 are already of different construction than that of the previously discussed TS structures 108 and storage capacitors 110. More specifically, the TS trenches 111 have been lined with a silicide metal liner layer 206, which has been annealed to form silicide layers 208 in the bottoms of each of the trenches 111.

The silicide metal liner layer 206 may be composed of such metals as Ti, Ni, Co, W or the like. The silicide layer 208, which has been formed from the heat induced reaction of the metal liner 206 with the silicone (Si) in the S/D regions 120, 122, may be composed of TiSi2, NiSi, CoSi2, WSi2 or other similar silicides. Contrary to the previous embodiment of structure 100, the silicide metal liner 206 of structure 200 has not been removed.

TS conduction metal 210 has also been disposed in all of the TS trenches 111 and planarized down to the top level of the ILD layer 114. The TS conduction metal 210 is substantially the same composition as the TS conduction metal 140 in semiconductor structure 100.

Figure 11A:
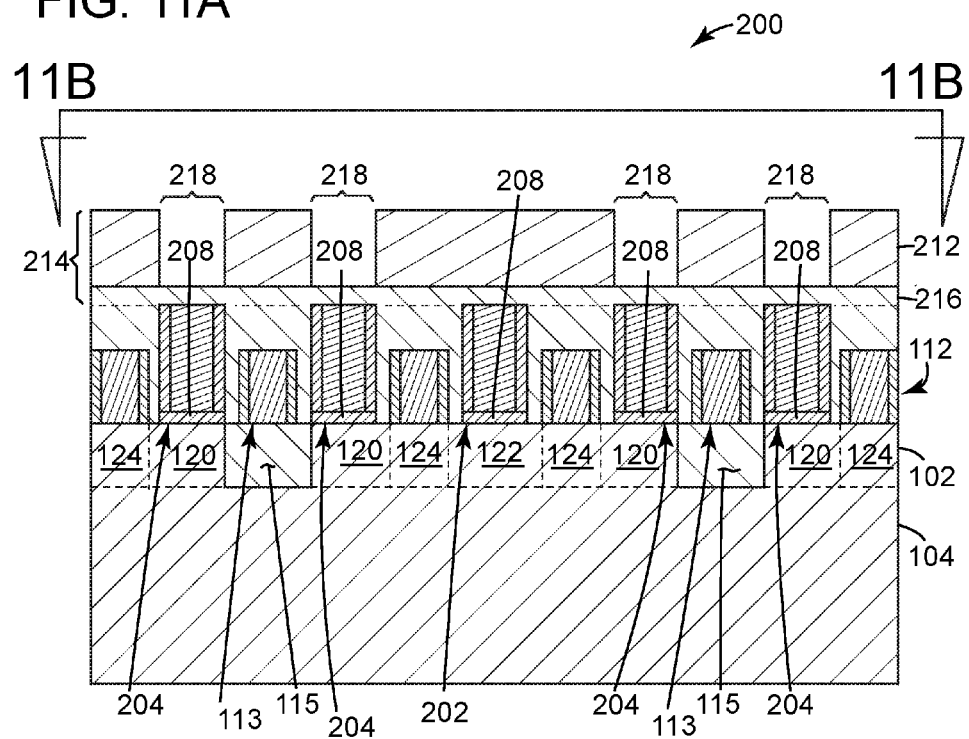
FIG. 11A is a cross-sectional view of FIG. 10 having a first (1st) lithographic (litho) stack disposed thereon and CA capacitor openings patterned into a resist layer of the 1st litho stack in accordance with the present invention.
Figure 11B:
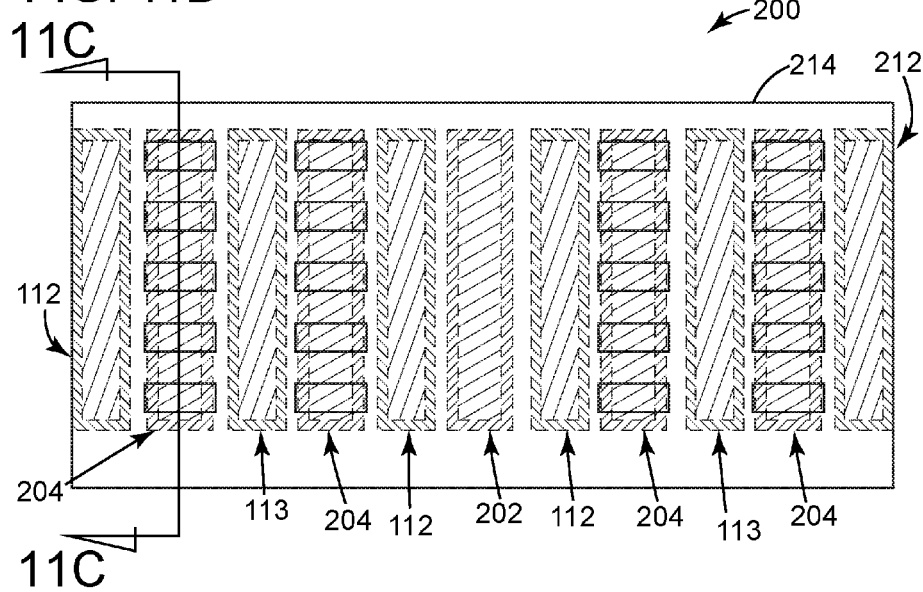
FIG. 11B is a top view of FIG. 11A taken along the line 11B-11B in accordance with the present invention.
Figure 11C:
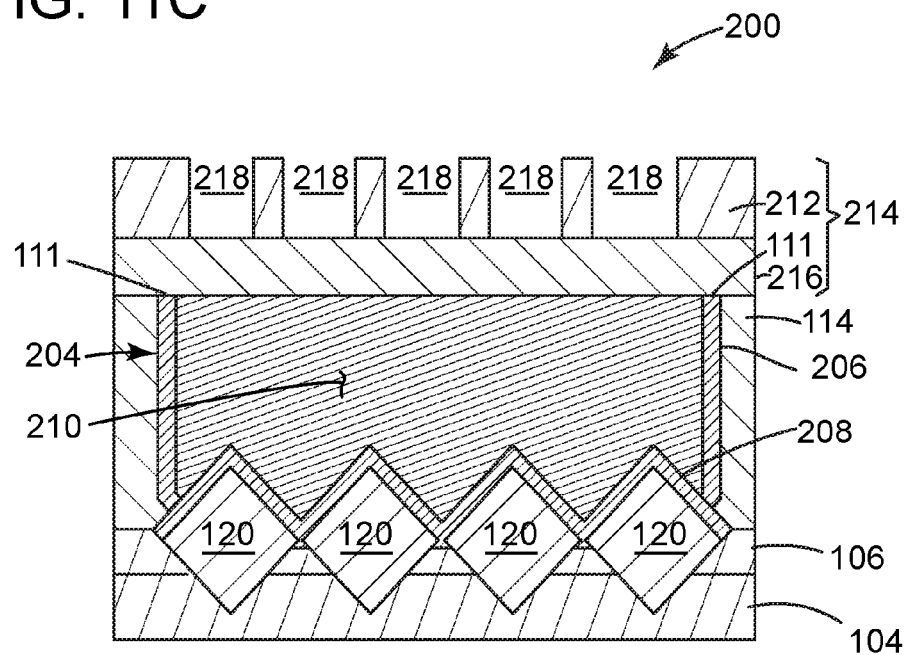
FIG. 11C is a cross-sectional view of FIG. 11B taken along the line 11C-11C in accordance with the present invention.

Referring to FIGS. 11A, 11B and 11C, the structure 200 of FIG. 10 having a first (1st) photo resist mask 212 disposed thereon is presented. FIG. 11A is a side cross-sectional view of the structure 200. FIG. 11B is a top cross-sectional view of the structure 200 in FIG. 11A taken along the line 11B-11B. FIG. 11C is a side cross-sectional view of structure 200 in FIG. 11B taken along the line 11C-11C.

Referring more specifically to FIG. 11A, a first lithographic stack (1st litho stack) 214 is next disposed onto the structure 200. The 1st litho stack 214 includes the 1st photo resist mask layer 212 as its top layer, but can be composed of several different kinds of layers, depending on such parameters as the application requirements, design or proprietary preferences or the like. For example, the remaining stack of layers 216 in the 1st litho stack 214 may include a stack of four layers. Those four layers could include (from bottom to top) an oxide layer, a spin-on hardmask layer, a SiON cap layer and a bottom antireflective coating (BARC) layer disposed below the 1st photo resist layer 212.

Once the 1st litho stack 214 is disposed over structure 200, a plurality of CA capacitor openings 218 are patterned into the 1st resist layer 212 through well-known lithographic techniques. The CA capacitor openings 218 are disposed in predetermined positions where CA capacitor contacts 222 (best seen in FIG. 14) would land on the storage capacitor structures 204. As such, the CA capacitor openings 218 are not patterned over any gate structures 112 or TS structures 202.

Referring more specifically to FIG. 11B, it can be seen from this top view that the CA capacitor openings 218 expose only specific, typically rectangular, areas over the storage capacitor structures 204 where the CA capacitor contacts 222 would land. As such, there are a plurality of these typically rectangular CA capacitor openings 218 disposed along the lengths of each storage capacitor structure 204.

Referring more specifically to FIG. 11C, a cross-sectional view of FIG. 11B taken along the line 11C-11C is presented. FIG. 11C is also a cross-sectional view of storage capacitor structure 204 at an intermediate stage of manufacture. As can be seen from this view, the entire perimeter of TS trench 111 is conformally coated with the silicide metal liner layer 206, including the bottom of the TS trench 111 where a plurality of the S/D regions 120 are disposed along the TS trench 111. Additionally, the TS conduction metal 210 is disposed in and substantially fills the TS trench 111. Further the CA capacitor openings 218 can be seen disposed over and along the length of the capacitor structure 204.

Figure 12:
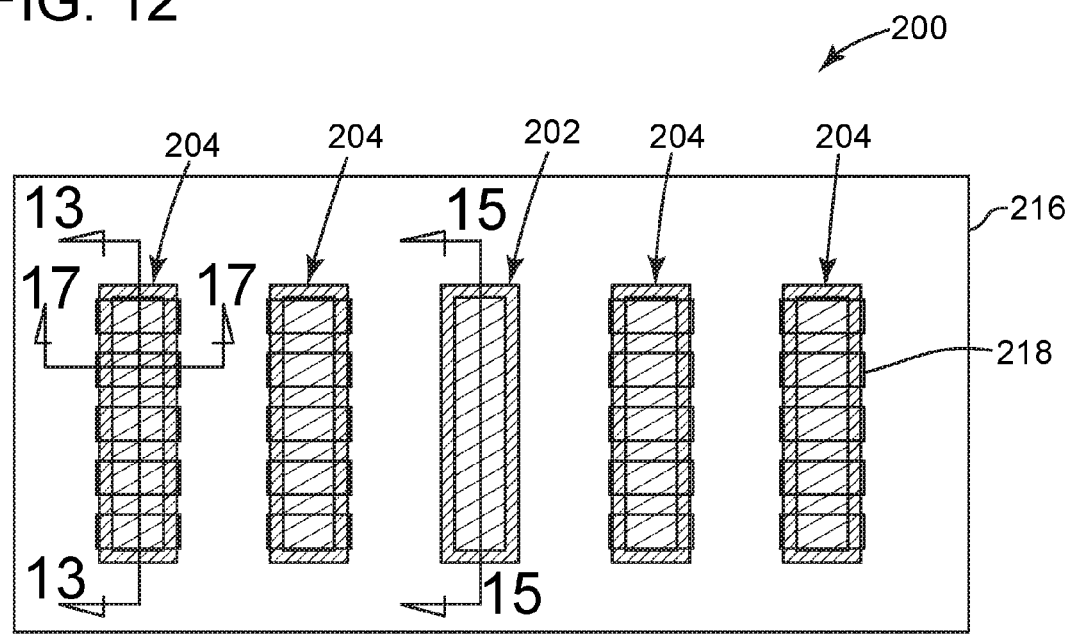
FIG. 12 is a top view of FIG. 11A with the resist layer removed in accordance with the present invention.

Referring to FIG. 12, a top view of the structure 200 of FIG. 11C with the CA photo resist layer 212 removed is presented. For purposes of simplicity and clarity, the gate structures 112 are not shown in FIG. 12.

The CA photo resist layer 212 can be removed by a wet etch or similar process. Additionally, one or more of the layers in stack 216 may also be removed through well-known processes. For purposes of this embodiment, it will be assumed that only a bottom oxide layer now composes the remainder of stack 216.

Figure 13:
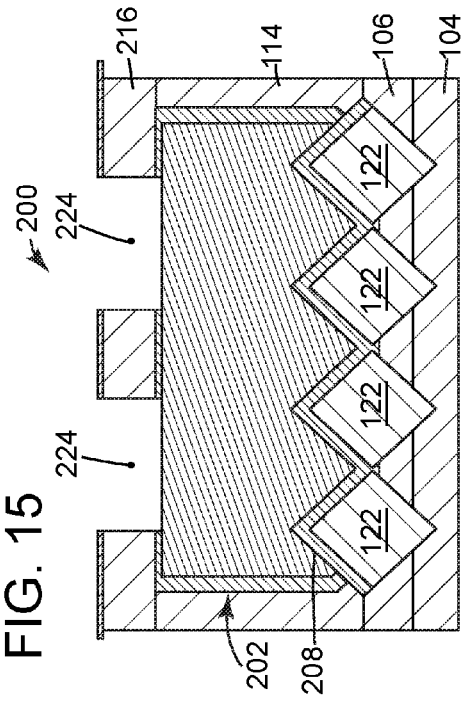
FIG. 13 is a cross-sectional view of FIG. 12 taken along the line 13-13 having the CA capacitor openings etched into the TS conduction metal of the TS trenches and a capacitor dielectric layer disposed thereon in accordance with the present invention.

Referring to FIG. 13, a cross sectional view of the structure 200 in FIG. 12 taken along the line 13-13 is presented. Next in the process flow, the CA capacitor openings 218 are etched through the remaining layers of stack 216 and into the TS conduction metal 210 of storage capacitor 204. The etching can be done by a reactive ion etching (RIE) process or similar. The CA capacitor openings 218 are etched well into the TS trench 111 but stop short of the bottom of the TS trench 111 where the silicide layer 208 would be exposed.

Next a capacitor dielectric layer 220 is disposed over the CA capacitor openings 218 to conformally coat the CA capacitor openings 218 in the TS trench 111. The capacitor dielectric 220 is a high-k dielectric liner layer, which may be composed of such material as hafnium dioxide (HfO2), nitride hafnium silicates (HfSiON) or the like.

Figure 14:
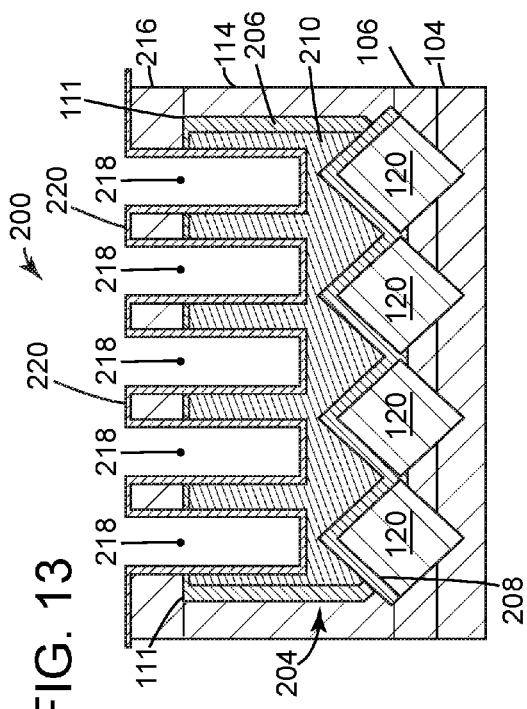
FIG. 14 is a cross-sectional view of FIG. 13 having CA capacitor contacts disposed in the TS trenches in accordance with the present invention.

Referring to FIG. 14, next the CA capacitor openings 220 are filled with CA capacitor contacts (or CA capacitor contact metal) 222. The CA capacitor contacts 222 may be composed of titanium nitride TiN, tantalum nitride (TaN) and/or such bulk conducting metals as tungsten (W), cobalt (Co), ruthenium (Ru) or similar. CA capacitor contacts 222 may also be composed of metal that is similar to the TS conduction metal 210 used in the formation of the TS structures 202.

At this point in the process flow, the storage capacitor 204 is now fully formed. The capacitor 204 is a MIM capacitor 204 disposed within the TS trench 111. The capacitor 204 includes the TS conduction metal 210 as a 1st terminal, the CA capacitor contact metal 222 as a 2nd terminal and the capacitor dielectric 220 therebetween. Moreover, the plurality of CA capacitor openings 218 that are conformally coated with the capacitor dielectric 220 is advantageous because they can potentially increase the overall area of the storage capacitor 204 relative to the storage capacitor 110 in the previous embodiment.

Figure 15:
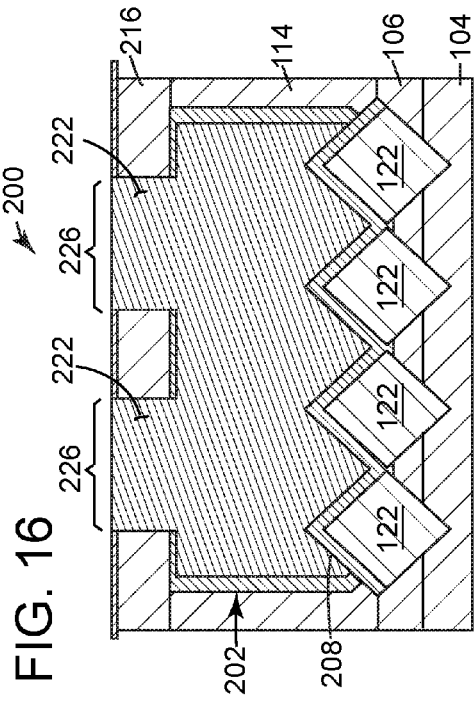
FIG. 15 is a cross-sectional view of FIG. 12 taken along the line 15-15 having CA contact openings patterned thereon in accordance with the present invention.

Referring to FIG. 15, a cross-sectional view of the structure 200 in FIG. 12 taken along the line 15-15 is presented. Once the MIM capacitors 204 have been formed, the next step in the process flow is to form normal CA contacts 226 (best seen in FIG. 16) over the TS structures 202 of semiconductor structure 200.

Herein, normal CA contacts 226 are those contacts that perform the conventional function of electrically activating the S/D regions 122 through the TS structures 202. To form such CA contacts 226 a second litho stack (not shown) is disposed over the structure 200. CA contact openings 224 are then patterned into the stack 216 and disposed over the TS structure 202.

Figure 16:
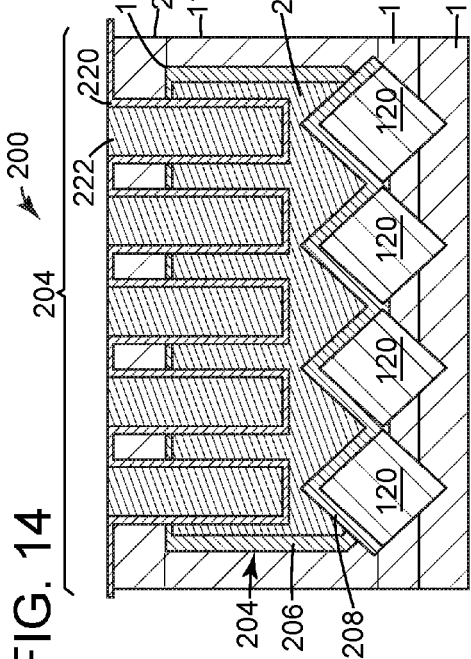
FIG. 16 is a cross-sectional view of FIG. 15 having the CA contact openings filled with CA contacts to complete formation of the eDRAM cells in accordance with the present invention.

Referring to FIG. 16, next the second litho stack is removed. The CA contact openings 224 are then filled with the same or similar type of metal used in the formation of CA capacitor contacts 222 to complete the formation of the CA contacts 226. With the formation of the CA contacts 226, the TS structures 202 of the eDRAM cells 201 may be connected through an interconnect system (not shown) of semiconductor structure 201 to a system bit line 32 in similar fashion as shown in schematic diagram 10.

Figure 17A:
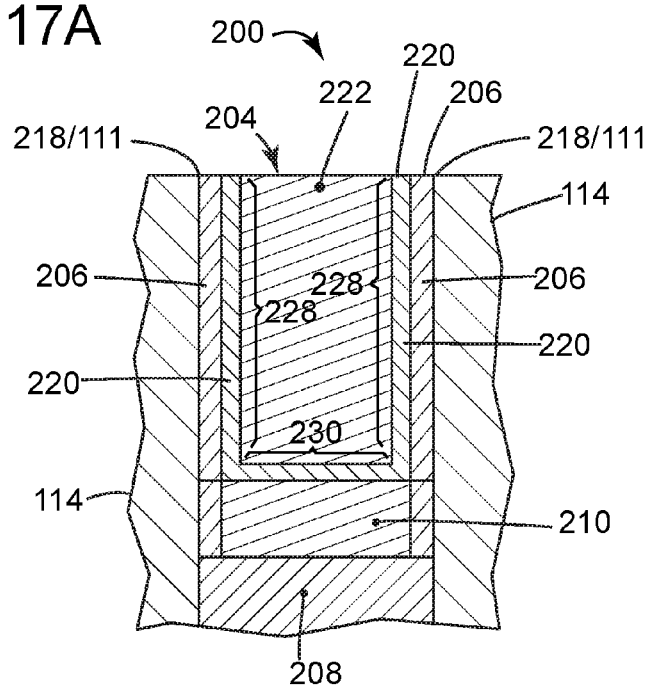
FIG. 17A is an embodiment of a cross-sectional view of FIG. 12 taken along the line 17-17 after the eDRAM cells have been completed in accordance with the present invention.
Figure 17B:
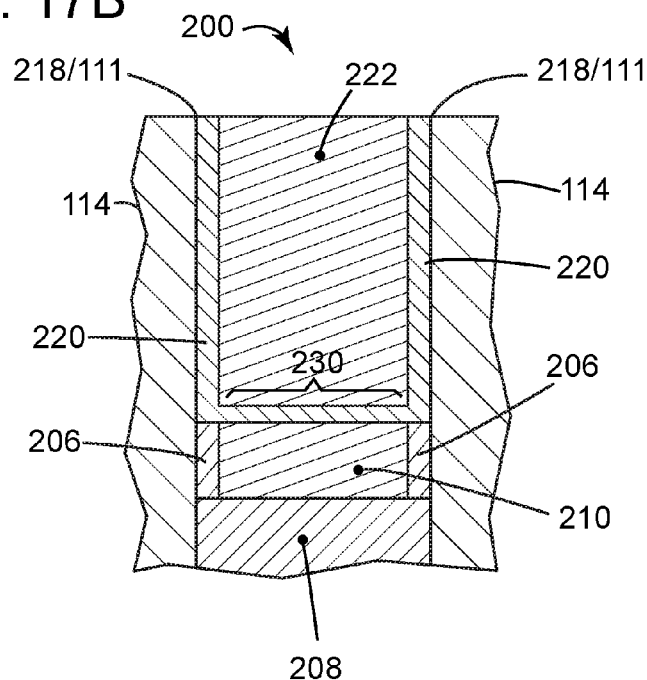
FIG. 17B is an alternative embodiment of a cross-sectional view of FIG. 12 taken along the line 17-17 after the eDRAM cells have been completed in accordance with the present invention.

Referring to FIGS. 17A and 17B, cross-sectional views of alternative embodiments of the structure 200 in FIG. 12 taken along the line 17-17 is presented. At this stage of the process flow, the eDRAM cells 201 have been completed, including the formation of the capacitor structures 204.

Referring more specifically to FIG. 17A, an important factor in determining the magnitude of capacitance value, and therefore energy storage value, of a capacitor is the overall capacitor area of the 1st terminal/dielectric/2nd terminal interface. In the case of the storage capacitor 204, that capacitor area would include the portions of the CA capacitor openings where the dielectric layer 220 is disposed between two metal layers that can function as a 1st terminal and a 2nd terminal.

This capacitor area can be significantly affected during the etching process of the CA openings 218 (best seen in FIGS. 12 and 13). More specifically, if just the TS conduction metal 210 is etched down through the openings 218, and the silicide metal layer 206 which lines the perimeter of TS trenches 111 is not etched, then the cross-sectional view along line 17-17 will look like the view in FIG. 17A. If, however, both the TS conduction metal 210 and the silicide metal layer 206 are both etched down, then the cross-sectional view along line 17-17 will look like the view in FIG. 17B.

Comparing FIGS. 17A and 17B, it can be seen that the capacitor area on FIG. 17A is significantly larger than that of FIG. 17B, even though both configurations could adequately function in accordance with the present invention. This is because the silicide metal layer 206 extends vertically along substantially the entire sidewall 228 of the TS trenches 111 (which are also a portion of the CA capacitor openings 218 in this view) because the silicide metal layer 206 was not etched down when the TS conduction metal 210 was etched. As a result, along the sidewalls 228 of TS trenches 111, the silicide metal layer 206 functions as the 1st terminal of capacitor 204. Additionally, along the bottom 230 of TS trenches 111, the TS conduction metal 210 functions as the 1st terminal of capacitor 204.

By contrast, the capacitor area in FIG. 17B is significantly smaller than in FIG. 17A because the silicide metal layer 206 has been etched down to the bottom 230 of the TS trenches 111 along with the TS conduction metal 210. As a result, the dielectric layer 220 abuts the ILD dielectric layer 114 and does not form a functioning 1st metal terminal/dielectric/2nd metal terminal along the sidewalls 230. Rather the only such 1st terminal/dielectric/2nd terminal interface is at the bottom 230 of the TS trenches 111 where the TS conduction metal 210 still functions as the 1st terminal of capacitor 204.

Figure 18:
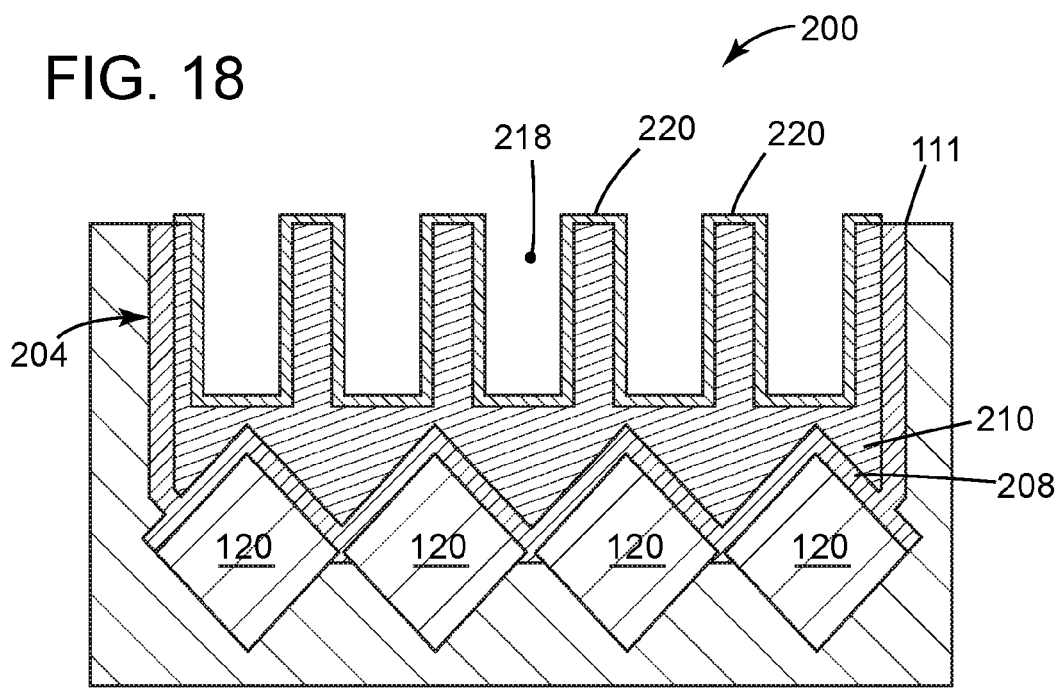
FIG. 18 is a cross-sectional view of the semiconductor structure having the capacitor dielectric layer extended over top surfaces of the TS trenches in accordance with the present invention.

Referring to FIG. 18, another way to increase the capacitor area is by extending the capacitor dielectric layer 220 as shown over the top surface of the TS trenches 111. In order to do this, a masking operation would have to be performed over the TS trenches 111 to remove the remaining stack 216 prior to disposing the dielectric layer 220 over structure 200.

Figure 19:
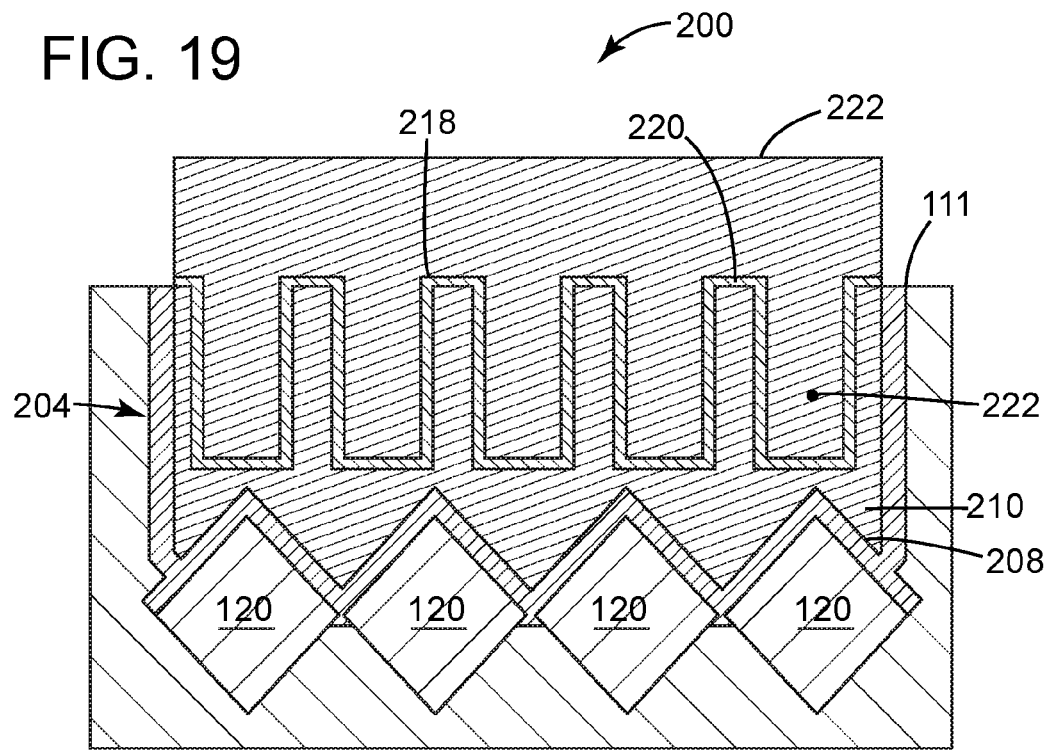
FIG. 19 is a cross-sectional view of FIG. 18 having capacitor contact metal disposed thereon in accordance with the present invention.

Referring to FIG. 19, the CA capacitor contact metal 222 can then be disposed over the structure 200 to not only fill the CA openings 218, but to also cover the portions of the dielectric layer 220 disposed on the top surfaces of the TS trenches 111. Therefore, a functioning 1st terminal (TS conduction metal 210)/dielectric high-k dielectric layer 220)/2nd terminal (CA contact metal 222) interface is formed at the top surfaces of the TS layer as well as along the sidewalls and bottoms of the CA openings 218.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor structure comprising:
an array of fins extending horizontally across a substrate;
a plurality of transistors embedded in the fins, the transistors including a $1^{st}$ S/D region and a $2^{nd}$ S/D region defining a channel region therebetween, the transistors having a gate structure disposed over the channel region and extending perpendicular to the fins;
an ILD layer disposed over the structure, the ILD layer including a plurality of TS trenches disposed over the $1^{st}$ and $2^{nd}$ S/D regions and extending parallel to the gate structures, and
a plurality of storage capacitors disposed within the TS trenches, the storage capacitors including a $1^{st}$ terminal electrically connected to one of the $1^{st}$ and $2^{nd}$ S/D regions, a $2^{nd}$ terminal and a capacitor dielectric disposed therebetween; and
wherein each transistor is electrically connected to a single storage capacitor to form an eDRAIVI cell.

2. The semiconductor structure of claim 1 comprising:
a plurality of TS structures alternatingly disposed in parallel with the storage capacitors, each TS structure connected to the other of the $1^{st}$ and $2^{nd}$ S/D regions of the transistors.

3. The semiconductor structure of claim 2 comprising:
each TS structure being electrically connected to a bit line through an interconnect system of the semiconductor structure;
each TS structure being electrically connected to the other of the $1^{st}$ and $2^{nd}$ S/D regions of a pair of transistors to form a pair of eDRAM cells; and
each pair of eDRAIVI cells being bordered by an isolation region.

4. The semiconductor structure of claim 1 wherein:
each gate structure is electrically connected to a word line through an interconnect system of the semiconductor structure;
each storage capacitor is connected to a system ground though the interconnect system; and
each of the other $1^{st}$ and $2^{nd}$ S/D regions of the transistor are connected to a bit line through the interconnect system.

5. The semiconductor structure of claim 1 wherein the storage capacitor includes:
the $1^{st}$ terminal being formed from a metal liner layer, the metal liner layer being disposed upon and electrically connected to the one of the $1^{st}$ and $2^{nd}$ S/D regions of the transistors; and
the $2^{nd}$ terminal being formed from TS conduction metal, the TS conduction metal being electrically connected to the system ground.

6. The semiconductor structure of claim 5 wherein the metal liner layer conformally coats an entire perimeter of the TS trenches.

7. The semiconductor structure of claim 1 wherein the storage capacitor includes:
the $1^{st}$ terminal being formed from TS conduction metal, the TS conduction metal being disposed upon and electrically connected to a silicide layer at the bottom of the TS trenches, the silicide layer electrically connected to the one of the $1^{st}$ and $2^{nd}$ S/D regions of the transistors; and
the $2^{nd}$ terminal being formed from a CA capacitor contact disposed within a CA capacitor opening, the CA capacitor opening extending into the TS conduction metal within the TS trenches, the CA capacitor contact being electrically connected to the system ground.

8. The semiconductor structure of claim 7 wherein the CA capacitor contact is a plurality of CA capacitor contacts within the TS trenches.

9. The semiconductor structure of claim 7 comprising the $1^{st}$ terminal also being formed from a silicide metal layer disposed against sidewalls of the TS trenches.

10. The semiconductor structure of claim 7 comprising:
portions of the capacitor dielectric being disposed over sidewalls of the CA capacitor openings and over top surfaces of the TS trenches; and
the CA capacitor contact filling the CA openings and covering the portions of the capacitor dielectric that are disposed on the top surfaces of the TS trenches.

11. A method comprising:
providing a semiconductor structure, the structure including:
an array of fins extending horizontally across a substrate,
a plurality of transistors embedded in the fins, the transistors including a $1^{st}$ S/D region and a $2^{nd}$ S/D region defining a channel region therebetween, the transistors having a gate structure disposed over the channel region and extending perpendicular to the fins, and
an ILD layer disposed over the structure, the ILD layer including a plurality of TS trenches disposed over the $1^{st}$ and $2^{nd}$ S/D regions and extending parallel with the gate structures, and
forming a plurality of storage capacitors within the TS trenches, the storage capacitors including a $1^{st}$ terminal, a $2^{nd}$ terminal and a capacitor dielectric disposed therebetween; and
electrically connecting one of the $1^{st}$ and $2^{nd}$ S/D regions of each transistor to the 1st terminal of a single storage capacitor to form a plurality of eDRAM cells.

12. The method of claim 11 comprising:
forming a plurality of TS structures alternatingly disposed in parallel with the storage capacitors;
electrically connecting each TS structure to the other of the $1^{st}$ and $2^{nd}$ S/D regions of each transistor.

13. The method of claim 12 comprising electrically connecting a TS structure to the other of the $1^{st}$ and $2^{nd}$ S/D regions of a pair of transistors to form a pair of eDRAM cells.

14. The method of claim 12 comprising:
electrically connecting the $2^{nd}$ terminals of the storage capacitors to a system ground through an interconnect system of the semiconductor structure;
electrically connecting the TS structures to a bit line through the interconnect system; and
electrically connecting the gate structures to a word line through the interconnect system.

15. The method of claim 11 comprising:
disposing a metal liner layer over the semiconductor structure, including the TS trenches;
disposing an ODL layer over the structure to fill the TS trenches;
recessing back the ODL layer to expose the metal liner layer on the upper portion of the TS trenches;
removing the exposed portions of the metal liner layer to form the $1^{st}$ terminal;
removing the ODL layer to expose the metal liner layer within the TS trenches;
disposing a capacitor dielectric layer over the structure, including the exposed metal liner layer, to form the capacitor dielectric;
disposing TS conduction metal over the semiconductor structure to fill the TS trenches; and
planarizing the TS conduction metal to form the $2^{nd}$ terminal.

16. The method of claim 15 comprising:
disposing a block mask layer over the semiconductor structure to expose only select TS trenches utilized to form TS structures;
removing the dielectric layer and metal liner layer from the select TS trenches to expose the S/D regions at the bottom of the select TS trenches;
forming a silicide layer over the exposed S/D regions; and
removing the block mask layer;
wherein disposing and planarizing the TS conduction metal forms the $2^{nd}$ terminals and the TS structures.

17. The method of claim 11 comprising:
disposing a silicide metal layer over the perimeter of the TS trenches;
heating the silicide metal layer to form a silicide layer at the bottom of the TS trenches;
disposing TS conduction metal over the semiconductor structure to fill the TS trenches;
planarizing the TS conduction metal down to the top level of the ILD layer;
disposing a first litho stack over the semiconductor structure;
patterning a plurality of CA capacitor openings disposed over a first set of TS trenches utilized to form the storage capacitors;
etching the CA capacitor openings into the TS conduction metal disposed in the first set of TS trenches;
conformally coating the CA capacitor openings in the first set of TS trenches with a capacitor dielectric layer; and
filing the CA capacitor openings with CA capacitor contacts.

18. The method of claim 17 comprising:
disposing a second litho stack over the semiconductor structure;
patterning a plurality of CA contact openings disposed over a second set of TS trenches utilized to form TS structures;
etching the CA contact openings down into the second litho stack to land on top surfaces of the second set of TS trenches; and
filling the CA contact openings with CA contacts.

19. The method of claim 17 wherein etching the CA capacitor openings into the TS conduction metal comprises not etching the silicide metal layer disposed on sidewalls of the TS trenches.

20. The method of claim 17 comprising:
disposing portions of the capacitor dielectric layer over top surfaces of the TS trenches; and
covering the portions of the capacitor dielectric layer disposed on the top surfaces of the TS trenches with CA contacts.

* * * * *

UNITED STATES PATENT AND TRADEMARK OFFICE
CERTIFICATE OF CORRECTION

PATENT NO. : 9,831,248 B1
APPLICATION NO. : 15/425366
DATED : November 28, 2017
INVENTOR(S) : Zang et al.

It is certified that error appears in the above-identified patent and that said Letters Patent is hereby corrected as shown below:

In the Specification

Column 1, Line 22: Delete "eDRAIVI" and insert -- eDRAM --

Column 1, Line 25: Delete "eDRAIVI" and insert -- eDRAM --

Column 1, Line 45: Delete "eDRAIVI" and insert -- eDRAM --

Column 1, Line 56: Delete "eDRAIVI" and insert -- eDRAM --

Column 2, Line 4: Delete "eDRAIVI" and insert -- eDRAM --

Column 2, Line 39: Delete "eDRAIVI" and insert -- eDRAM --

Column 2, Line 57: Delete "eDRAIVI" and insert -- eDRAM --

Column 2, Line 29: Delete "eDRAIVI" and insert -- eDRAM --

Column 5, Line 43: Delete "eDRAIVI" and insert -- eDRAM --

Column 5, Line 47: Delete "eDRAIVI" and insert -- eDRAM --

Column 5, Line 65: Delete "eDRAIVI" and insert -- eDRAM --

Column 6, Line 4: Delete "eDRAIVI" and insert -- eDRAM --

Column 9, Line 63: Delete "eDRAIVI" and insert -- eDRAM --

Column 10, Line 24: Delete "eDRAIVI" and insert -- eDRAM --

Signed and Sealed this
Twentieth Day of February, 2018

Andrei Iancu
*Director of the United States Patent and Trademark Office*

CERTIFICATE OF CORRECTION (continued)
U.S. Pat. No. 9,831,248 B1

Column 10, Line 25: Delete "eDRAIVI" and insert -- eDRAM --

Column 10, Line 26: Delete "eDRAIVI" and insert -- eDRAM --

Column 10, Line 28: Delete "eDRAIVI" and insert -- eDRAM --

Column 10, Line 33: Delete "eDRAIVI" and insert -- eDRAM --

In the Claims

Column 14, Line 14: Claim 1, Delete "eDRAIVI" and insert -- eDRAM --

Column 14, Line 27: Claim 3, Delete "eDRAIVI" and insert -- eDRAM --